United States Patent
Furukawa et al.

(10) Patent No.: US 6,924,200 B2
(45) Date of Patent: *Aug. 2, 2005

(54) METHODS USING DISPOSABLE AND PERMANENT FILMS FOR DIFFUSION AND IMPLANTATION DOPING

(75) Inventors: Toshiharu Furukawa, Essex Junction, VT (US); Mark C. Hakey, Fairfax, VT (US); Steven J. Holmes, Milton, VT (US); David V. Horak, Essex Junction, VT (US); William H-L Ma, Fishkill, NY (US); Patricia M. Marmillion, Colchester, VT (US); Donald W. Rakowski, Milton, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 10/222,035

(22) Filed: Aug. 16, 2002

(65) Prior Publication Data

US 2002/0197806 A1 Dec. 26, 2002

Related U.S. Application Data

(62) Division of application No. 09/524,677, filed on Mar. 13, 2000, now Pat. No. 6,506,653.

(51) Int. Cl.⁷ .................... H01L 21/336; H01L 21/21; H01L 21/302
(52) U.S. Cl. .................... 438/305; 438/301; 438/558; 438/563; 438/752
(58) Field of Search ................ 438/558, 305, 438/301, 559, 563, 745, 752

(56) References Cited

U.S. PATENT DOCUMENTS

| | | | |
|---|---|---|---|
| 4,766,093 A | * | 8/1988 | Hovel et al. ............ 156/628 |
| 5,013,675 A | | 5/1991 | Shen et al. |
| 5,102,816 A | | 4/1992 | Manukonda et al. |
| 5,234,852 A | | 8/1993 | Liou |
| 5,291,053 A | | 3/1994 | Pfiester et al. |

(Continued)

FOREIGN PATENT DOCUMENTS

JP          8213605 A          6/1995

*Primary Examiner*—Michael Trinh
(74) *Attorney, Agent, or Firm*—Schmeiser, Olsen & Watts; William D. Sabo

(57) ABSTRACT

Methods are provided that use disposable and permanent films to dope underlying layers through diffusion. Additionally, methods are provided that use disposable films during implantation doping and that provide a surface from which to dope underlying materials. Some of these disposable films can be created from a traditionally non-disposable film and made disposable. In this manner, solvents may be used that do not etch underlying layers of silicon-based materials. Preferably, deep implantation is performed to form source/drain regions, then an anneal step is performed to activate the dopants. A conformal layer is deposited and implanted with dopants. One or more anneal steps are performed to create very shallow extensions in the source/drain regions.

11 Claims, 15 Drawing Sheets

U.S. PATENT DOCUMENTS

| | | |
|---|---|---|
| 5,324,683 A | 6/1994 | Fitch et al. |
| 5,482,876 A | 1/1996 | Hsieh et al. |
| 5,510,645 A | 4/1996 | Fitch et al. |
| 5,592,017 A | 1/1997 | Johnson |
| 5,610,088 A | 3/1997 | Chang et al. |
| 5,616,515 A * | 4/1997 | Okuno ............... 438/478 |
| 5,696,016 A | 12/1997 | Chen et al. |
| 5,705,417 A | 1/1998 | Tseng |
| 5,710,054 A | 1/1998 | Gardner et al. |
| 5,736,446 A | 4/1998 | Wu |
| 5,780,350 A | 7/1998 | Kapoor |
| 5,831,319 A | 11/1998 | Pan |
| 5,963,817 A * | 10/1999 | Chu et al. ............... 438/410 |
| 6,027,975 A * | 2/2000 | Hergenrother et al. ...... 438/268 |
| 6,087,239 A | 7/2000 | Luengling |
| 6,117,750 A * | 9/2000 | Bensahel et al. ........... 438/478 |
| 6,153,455 A | 11/2000 | Ling et al. |
| 6,255,183 B1 | 7/2001 | Schmitz et al. |
| 6,506,653 B1 * | 1/2003 | Furukawa et al. .......... 438/305 |

\* cited by examiner

METHODS USING DISPOSABLE AND PERMANENT FILMS FOR DIFFUSION AND IMPLANTATION DOPING

This application is a Divisional of Ser. No. 09/524,677, filed on Mar. 13, 2000, now U.S. Pat. No. 6,506,653.

BACKGROUND OF THE INVENTION

1. Technical Field

This invention relates to the field of semiconductor processing. More specifically, the invention relates to methods using disposable and permanent films to dope underlying layers through diffusion and using disposable films during implantation doping.

2. Background Art

When doping semiconductor layers, and in particular source and drain regions for Metal Oxide Semiconductor Field Effect Transistors (MOSFETs), ion implantation methods followed by an activation anneal are generally used. Ion implantation causes quite a bit of imperfections and defects in the silicon structure. To activate the implanted dopants, high temperature (>900° C.) annealing is performed. This allows the implanted dopant atoms to migrate into proper crystal structures. The higher the activation temperature, the more implanted dopants are activated. However, the defects created by ion implantation enhance the diffusion of dopants, and it is more difficult to form shallow and low resistivity source/drain diffusions.

This enhanced diffusion associated with ion implantation is particularly detrimental when forming extensions. Extensions are shallow doped areas, in the source and drain regions of MOSFETs, that connect the device channel to the deeper source and drain diffusions. When the MOSFET's size is reduced, it is beneficial to scale the extensions to as shallow as possible to reduce short channel effects (while still allowing silicide to be formed in the deeper source and drain diffusion regions), and to dope the extensions as high as possible to reduce device series resistance.

What is needed are methods for doping underlying semiconductor layers without enhancing the dopant diffusion during an activation anneal. These methods should also allow extensions to be formed with very thin extensions to provide better junctions, yet allow adequate control over the extensions' doping. Additionally, these methods should allow for layers used for doping that can subsequently be removed without damaging the remaining structure.

DISCLOSURE OF INVENTION

According to the present invention, methods are provided that use disposable and permanent films to dope underlying layers through diffusion. Additionally, methods are provided that use disposable films doped by ion implantation. Some of these disposable films can be created from a traditionally non-disposable film.

The methods using removable or non-removable films to create shallow extensions use implantation doping to dope the removable film. During one or more anneal steps, the dopants diffuse from the removable or non-removable film and into the substrate. Methods using traditionally non-disposable films function by creating a water-soluble film from a film that originally is not water-soluble.

The advantages of this invention are very little or no implantation damage during the creation of the extensions, which enables formation of very shallow extensions. The latter is a very important advantage of the present invention, particularly because, as transistors are scaled smaller, extensions must be scaled proportionately to the transistor size. Additionally, preferred removable films are preferably removed with solvents that will not etch or attack substrate materials (such as silicon) or other films (such as silicon dioxide or polysilicon).

The foregoing and other features and advantages of the present invention will be apparent from the following more particular description of preferred embodiments of the invention, as illustrated in the accompanying drawings.

BRIEF DESCRIPTION OF DRAWINGS

Preferred embodiments of the present invention will hereinafter be described in conjunction with the appended drawings, where like designations denote like elements, and.

BEST MODE(S) FOR CARRYING OUT THE INVENTION

Figure 1:
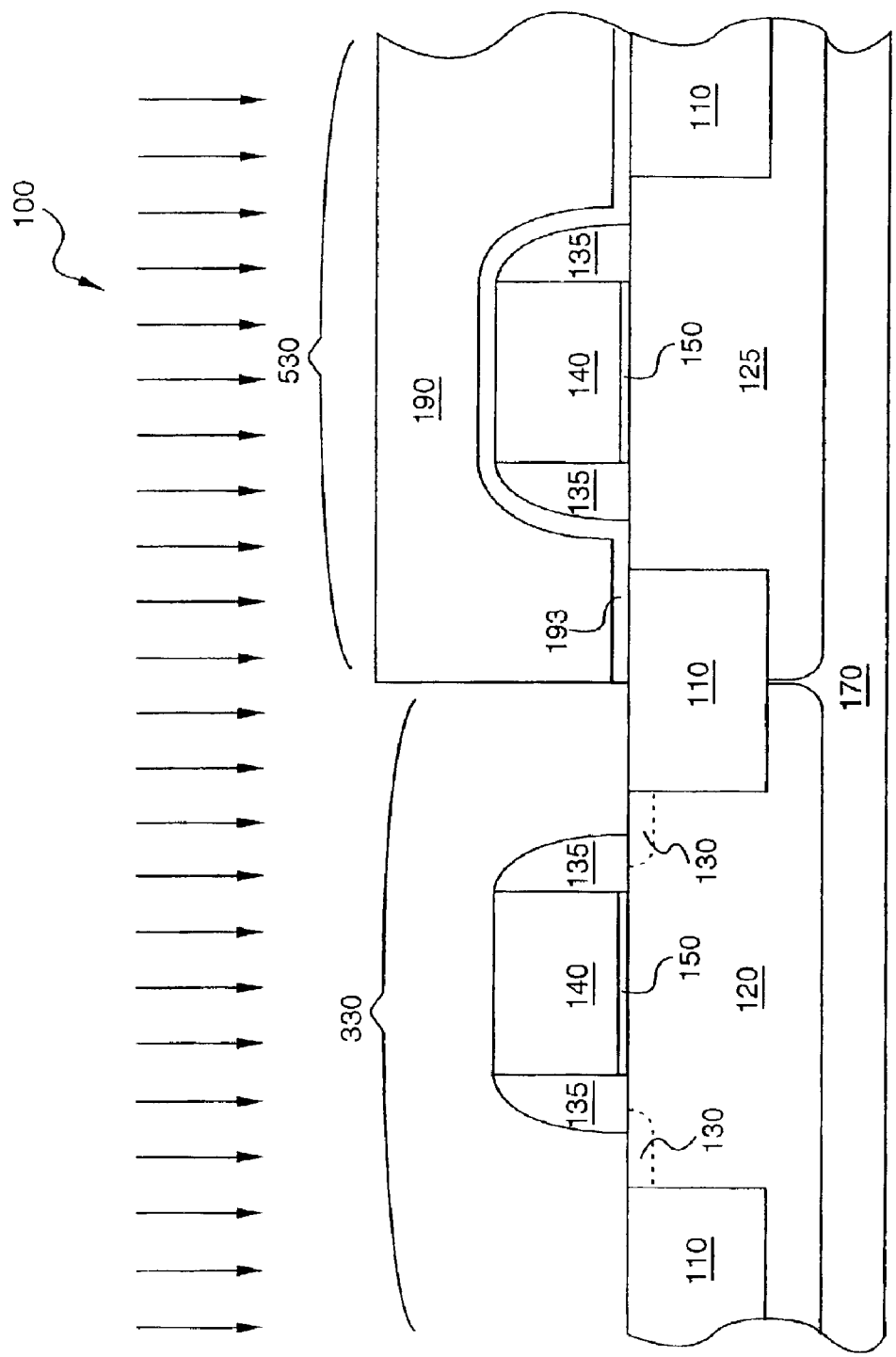
FIGS. 1–8 are cross-sectional views of successive processing steps for forming a CMOS device, having very shallow extensions, in accordance with a preferred embodiment of the present invention.

As discussed above, needs existed to provide methods for reducing the damage created when doping the extensions of Metal Oxide Semiconductor Field Effect Transistors (MOSFETs), for more adequately controlling the depth of doping the extensions, and for providing easily removable films. Also, a need existed to reverse the order of deep source/drain diffusion formation and the extension formation so that the extension activation anneal is independent of the deep source/drain diffusion activation anneal. The current invention meets these needs by doping the extensions of MOSFETs with either removable or non-removable films, using diffusion from solid dopant sources instead of ion implantation doping for the extension formation, and providing methods for turning germanium films or germanium-rich silicon-germanium ($Si_xGe_{(1-x)}$, with x less than or equal to 0.3) into water-soluble germanium dioxide or germanium-rich silicon-germanium dioxide, respectively. It should be noted that proper control of parameters and conditions when depositing $Si_xGe_{(1-x)}$ will allow x to be less than or equal to 0.3.

In preferred methods of the present invention, when creating disposable sidewall spacers or disposable conformal layers, germanium dioxide, germanium, or germanium-rich $Si_xGe_{(1-x)}$ may be used. If germanium or germanium-rich $Si_xGe_{(1-x)}$ is used for these purposes, the germanium is turned into water-soluble germanium dioxide, or the germanium-rich $Si_xGe_{(1-x)}$ is turned into germanium-rich silicon-germanium dioxide, by placing the semiconductor wafer in an oxidizing atmosphere at a certain temperature range for a particular time. Preferably, the oxidizing atmosphere is a plasma containing oxygen, as this allows for a lower temperature range. These steps should turn the germanium or germanium-rich $Si_xGe_{(1-x)}$ into water-soluble germanium-rich silicon-germanium dioxide. The germanium dioxide or germanium-rich silicon-germanium dioxide is then removed by dipping the semiconductor wafer into water. Using water as a solvent is beneficial because water will not etch underlying layers of substrate or films.

It should be noted that for germanium-rich $Si_xGe_{(1-x)}$ the x should be less than or equal to 0.3. If this is the case, oxidizing the silicon-germanium will allow an amorphous silicon oxide-germanium oxide to be formed that will be removable. This is primarily true because the silicon will usually be bound to oxygen that is itself bound to germanium. Moreover, any germanium oxide should surround be fairly well interspersed between silicon oxide. If the germanium level is too low, however, the germanium oxide will be surrounded by silicon dioxide and may not be soluble. Thus, it is preferred that the x in $Si_xGe_{(1-x)}$ be less than or equal to 0.3.

When using germanium dioxide for either the disposable sidewall spacers or disposable conformal layers, it can be beneficial to apply a protective layer on top of the germanium dioxide. This is true because during photoresist develop, some of the germanium dioxide may be removed. Therefore, a protective layer, such as an anti-reflective compound or thin conformal film, may be added to protect the germanium dioxide from the photoresist developer. This protective layer can then be removed after processing.

The conformally deposited removable layers, in preferred embodiments of the present invention, may be doped with the appropriate dopants in order to use diffusion doping to create source and drain regions. Generally, the removable layers will be doped through ion implantation. Alternatively, the removable layer may be in situ doped when the film is deposited by Chemical Vapor Deposition (CVD), instead of doping through ion implantation. An anneal of the semiconductor wafer causes the diffusion from the removable conformal layer into underlying layers. It is preferable that the removable conformal layer be doped with n-type dopants prior to being doped with p-type dopants. This sequence of steps allows a relatively short anneal step after the removable conformal layer has been doped with n-type dopants, which allows a longer total anneal time for the slower-diffusing n-type dopants, such as Arsenic (As). By doping the removable conformal layers through ion implantation or in situ doping and using them to diffusion-dope the underlying layers, very shallow extensions may be made. These extensions can be made very thin by adjusting parameters of the process. Additionally, if ion implantation doping is used, very little or no damage to the silicon substrate is caused because dopant ions are implanted mostly into the removable conformal areas. Prior art methods used ion implantation to dope the extensions (or doped the extensions and then performed deep implantation of the source and drain regions), which caused defects in the substrate of the semiconductor wafer.

An example of a prior art method that is flawed is Japanese patent 8,312,605, assigned to OKI Electric Ind. Co., Ltd., dated Aug. 20, 1996. In this patent, the inventors disclose depositing a layer of in situ boron-doped germanium or silicon-germanium onto a substrate containing a gate. They then anneal the wafer to drive boron into the substrate to form p+ extensions. They directionally etch the conformal layer to form the spacer and then perform ion implantation of the deep source/drain regions. An anneal is performed to activate the dopants.

A detriment to this method is that the extensions will be much deeper than desired. The anneal to activate the deeply implanted source/drain dopants also drives the extensions in deeper. Additionally, the defects created by the source and drain implant enhance the diffusion of the extension dopant during the anneal. Thus, the extensions cannot be made shallow enough. Finally, to remove the layer of silicon-germanium or germanium, the inventors use a mixture of hydrofluoric acid (HF) and nitric acid ($HNO_3$). These acid solutions attack silicon dioxide and silicon, and remove silicon dioxide from isolation trenches or the edges of gate oxide and silicon from the substrate and polysilicon gate.

Another flawed method of creating extensions is shown in U.S. Pat. No. 5,710,054, to Gardner et al., issued on Jan. 20, 1998. In this patent, the inventors disclose doping a polysilicon spacer material and using this to diffusion dope the extensions. Since the polysilicon spacers cannot be removed without damaging the silicon substrate and the gate polysilicon, the polysilicon spacers are left on the wafer. This structure is prone to defects shorting the gate to the diffusions, particularly when the gate and diffusions are silicided.

The preferred methods of the current invention have none of the detriments of this prior art. In preferred embodiments of the present invention, the formation (ion implantation and anneal) of deep source/drain regions occurs before the extensions are doped. In this manner, the depth of the extension doping may be much more tightly controlled, and the depth of the extension doping is independent of the depth of deep source/drain diffusions. Additionally, very little or no implantation damage occurs because an overlying layer of material that is used as a diffusion source to dope the extensions receives the majority of dopant ions caused by ion implantation. Finally, the materials used both for the spacers that are used when implanting the source/drain regions and for the doping source layer may be removed using solvents that do not attack silicon or silicon dioxide. Thus, the current invention overcomes the majority of the problems of the prior art.

The following figures detail preferred embodiments and methods used to create Complementary Metal Oxide Semiconductor (CMOS) Field Effect Transistors (FETs). Each MOSFET will have very shallow extensions, the shallow extensions formed with little or no implantation damage. Thus, the preferred methods create shallow extensions and MOSFETs with very low resistivity and shallow junctions in the extensions. In these methods and the accompanying claims, the steps are only illustrative and are not to be considered to be in order, unless an order is necessary.

Referring now to FIG. 1, semiconductor wafer portion 100 has two wells 120, 125 in substrate 170. It is to be understood that wafer portion 100 is part of a semiconductor, generally a semiconductor wafer (the entire wafer is not shown in the following figures). Well 120 is a light to medium doped p-well, while well 125 is a light to medium doped n-well. These wells are usually separated from other wells under Shallow Trench Isolation (STI) regions 110. Gate dielectric 150 and gate conductor 140 are films that have already been patterned into gates. Generally, gate dielectric 150 is a thermally grown oxide, but could be a deposited nitride or other suitable deposited material. Usually, gate conductor 140 is a deposited polysilicon, but it could be any other suitable conductive material. The polysilicon gates 140 have been created by etching with a patterned photoresist mask (not shown). If necessary, halo implantation is made for each type of CMOS device with appropriate photoresist mask after the gate polysilicon etch (not shown). Sidewall spacers 135 are formed by conformally depositing a material, then anisotropically etching the material to remove materials on the horizontal surfaces but not on sidewalls or vertical surfaces. Generally, a Reactive Ion Etch (RIE) is used to etch material 135 and form spacers 135. However, any appropriate etch may be used.

A photoresist film 190 is deposited and patterned to cover area 530 and expose area 330. An As (arsenic) or P (phosphorous) implantation is performed in the energy range of 10 kilo-electron volts (KeV) to 20 KeV, to implant deep source and drain locations 130 to a high dose (illustratively, $1 \times 10^{15}$ to $5 \times 10^{15}$ ions/cm$^2$). Material 135 is preferably removable, such as germanium dioxide (the proper type—amorphous germanium dioxide—that is removable in water), polycrystalline or amorphous germanium (which can then be converted to the removable germanium dioxide), or germanium-rich silicon-germanium ($Si_xGe_{(1-x)}$, with x less than or equal to 0.3, which can be converted to removable germanium-rich silicon-germanium dioxide). In the following example, material 135 is amorphous germanium dioxide, which can be removed by dipping the wafer in water for a certain time. The germanium dioxide or germanium-rich silicon germanium dioxide is preferably deposited by Chemical Vapor Deposition (CVD), by placing the wafer in an atmosphere of $GeH_4$ and oxygen at an elevated temperature, or by plasma CVD at lower temperature, or by Jet Vapor Deposition at room temperature.

As an optional but preferred step, a conformal protective film 193 is formed over the substrate and under photoresist layer 190 to protect spacers 135 from developer. Protective film 193 is particularly useful when spacers 135 comprise germanium dioxide, as germanium dioxide may be removed by developer. Polysilicon or amorphous germanium and silicon-germanium are less likely to be removed by developer, and should not require a protective film. Preferably, conformal protective film 193 is 50 nm of Anti-Reflective Coating (ARC) material, such as CD9 or CD11 by Brewer Science of Rolla, Mo., or DUV3, by Shipley of Marlborough, Mass. The ARC over area 330 is preferably removed through dry etching. Protective film 193 may comprise other films, such as 10–20 nm of plasma CVD silicon dioxide ($SiO_2$) or silicon oxynitride (SiON) or vapor deposited Parylene. If inorganic high temperature material such as silicon dioxide or silicon oxynitride is used for the protective layer, the layer may be kept during implantation and anneal process steps.

FIG. 1 thus shows the deep implantation of impurities to create deep source/drain regions. In the example of FIG. 1, an NMOS FET is being created in area 330.

Figure 2:
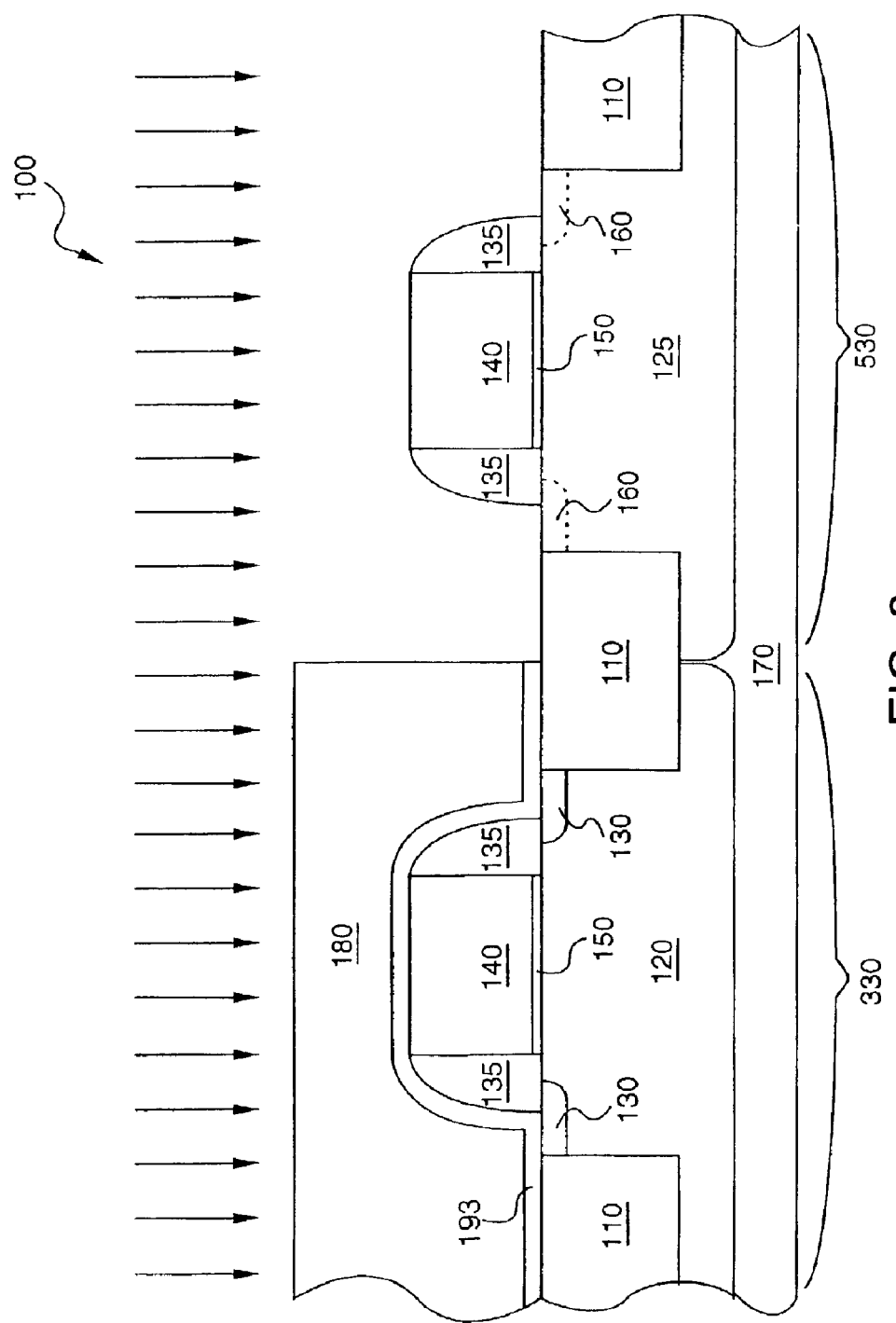

Turning now to FIG. 2, wafer portion 100 is shown after photoresist film 190 has been stripped off, and protective layer 193 removed by dry etching. Additionally, photoresist film 180 has been applied and patterned to cover area 330 while leaving area 530 exposed. Again, as an optional but preferred step, a conformal protective film 193 is formed over the substrate and under photoresist layer 180 to protect spacers 135 from developer. Protective film 193 is particularly useful when spacers 135 comprise germanium dioxide, as germanium dioxide may be removed by developer. Polysilicon or amorphous germanium and silicon-germanium are less likely to be removed by developer, and should not require a protective film. Preferably, conformal protective film 193 is 50 nm ARC material. The ARC over area 530 is preferably removed through dry etching. Alternatively, if high temperature materials are used as protective film 193, protective film 193 may be left on during implantation and anneal process steps.

A high dose (illustratively, $1 \times 10^{15}$ to $5 \times 10^{15}$ ions/cm$^2$) B (boron) implant is performed in an energy range of 1 to 5 KeV. The implant creates source/drain regions 160, for a PMOS FET in area 530. After the implantation, the wafer is annealed, usually at temperatures of about 900° C. to 1200° C. and for a time of about one second to 5 minutes. This reduces the damage caused by implantation and activates the dopants. Additionally, the dopants diffuse somewhat through well 120 and create deeper, wider source/drain regions 130.

Figure 3:
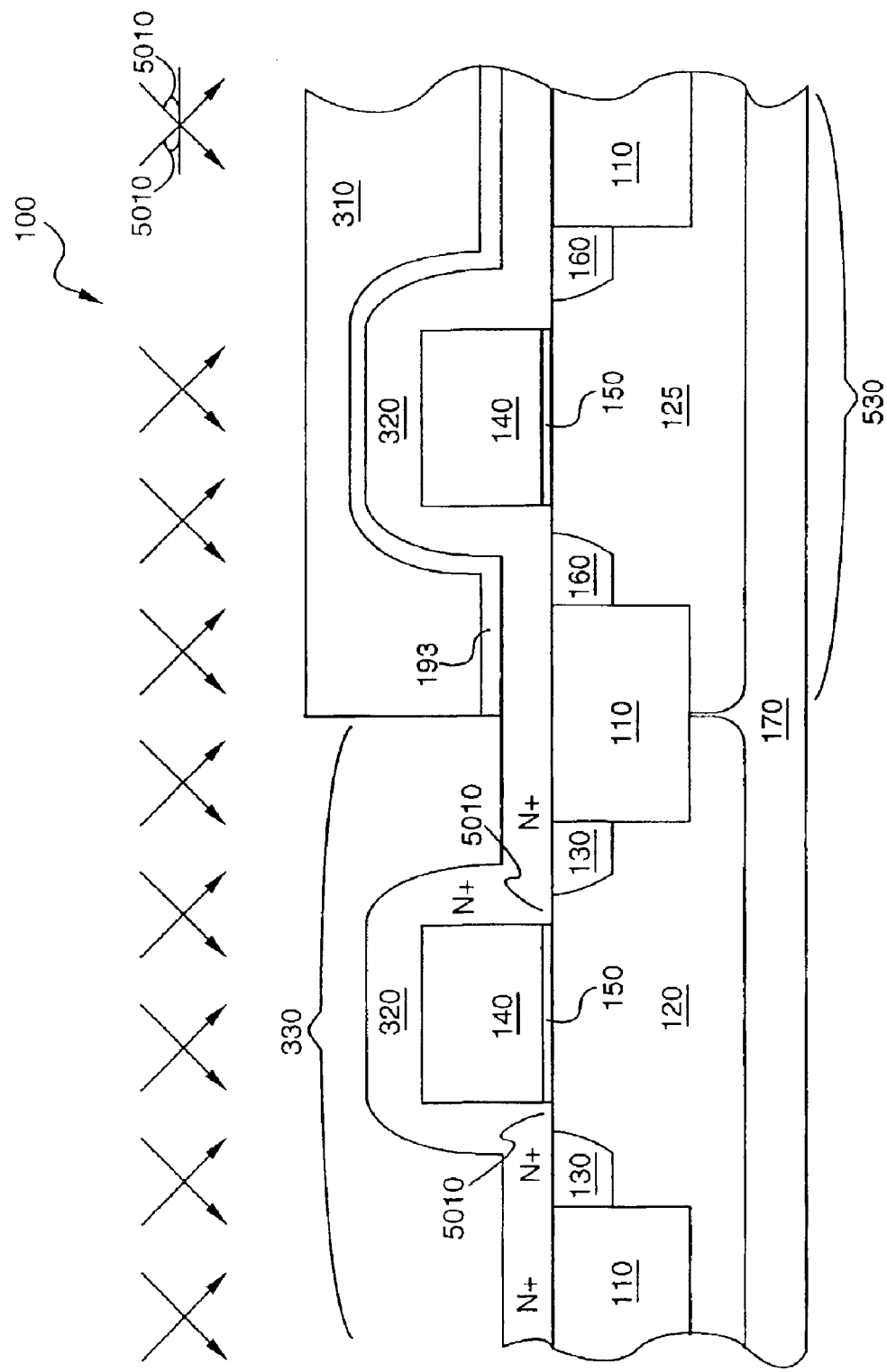

Referring now to FIG. 3, wafer portion 100 is shown after photoresist film 180 has been stripped, after protective layer 193 has been removed through dry etching, and after sidewall spacers 135 have been removed. When material 135 is germanium dioxide, the germanium dioxide is removed by dipping in water. A layer of removable material 320 is conformally deposited over the surface of wafer portion 100. Removable material 320 is preferably between 50 nanometers (nm) and 200 nm thick, most preferably about 100 nm thick. Removable material 320 in this example is germanium dioxide, which is again deposited through CVD. Photoresist layer 310 has been applied and patterned to cover area 530 and expose area 330.

As an optional but preferred step, a conformal protective film 193 is formed over the substrate and under photoresist layer 310 to protect removable material 193 from developer. Preferably, conformal protective film 193 is 50 nm of ARC material. The ARC over area 330 is preferably removed through dry etching. Alternatively, if a high temperature material is used as protective film 193, protective film 193 may be left on during implantation and anneal process steps.

A high dose n-type dopant implantation is performed to create n+ doping in layer 320 of area 330. This implantation is preferably performed at a 45 degree to 60 degree angle (angles 5010), relative to the surface of the semiconductor, to make sure that layer 320 is implanted at locations 5020, which are the gate's bottom corners. This implantation is preferably performed in an energy range where most (>60%) of the implanted dopant is implanted into layer 320. For example, for arsenic, an energy range of 100 to 200 KeV, at a 45 degree angled input should implant the majority of dopants in a layer 320 of 100 nm thickness. The ideal situation in FIG. 3 is to implant dopants close to the surface of source/drain regions 130, but not into source/drain regions 130. The present invention preferably reduces damages caused by implantation, so using too high of an energy during implantation could case dopants to pierce layer 320 and enter source/drain regions 130. The latter is not desired. The thickness of layer 320, the material used, the dopant used, and the energy may be adjusted to ensure that the majority of dopants remain in layer 320 during ion implantation.

It should also be noted that in situ doping of layer 320 may be performed. In in situ doping, all the dopants are in the layer 320. There is no ion implantation damage with this method.

Figure 4:
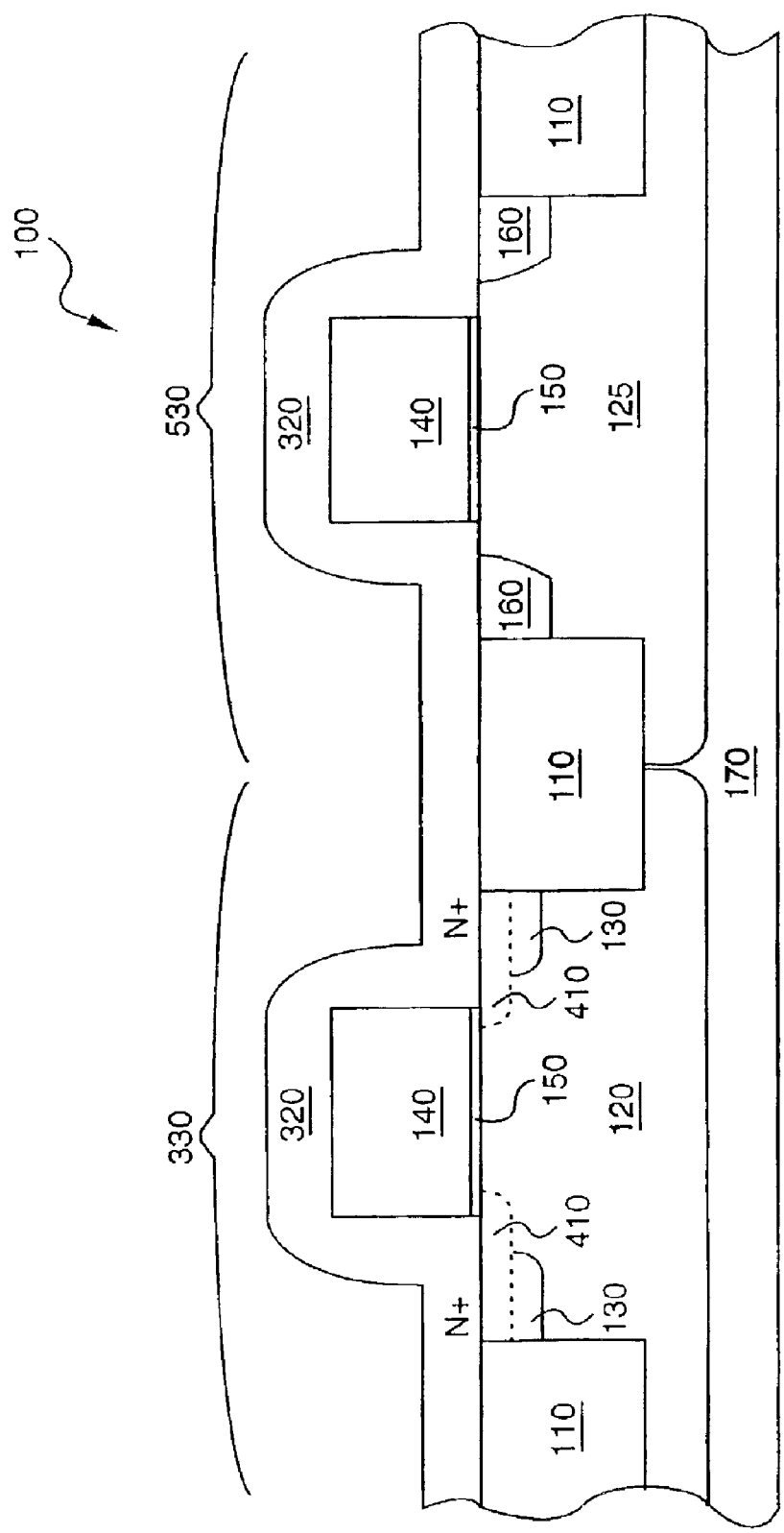

FIG. 4 illustrates an optional anneal step. FIG. 4 is shown after the resist 310 has been stripped and protective coating 193 has been removed. It should be noted that, if a high temperature material is used as protective film 193, protective film 193 may be left on during implantation and anneal process steps. Now that the removable material 320 in area 330 is heavily doped with n-type dopants (such as As), it is preferable that a short anneal be performed. The short anneal is preferably performed because of the relatively slow diffusion rate of arsenic, as compared to boron. The present methods are preferably used to create both types of extensions, so additional steps will create p+ extensions (using, for instance, B) in area 530. Because As diffuses slower than B, if the anneal times for both are the same, the extensions will be different widths and depths. This could have undesirable effects, such as not enough overlap of the n+ extension and gate, or too much overlap of the p+ extension. Thus, it is preferred that a short anneal be performed before implanting p-type dopants.

The preferred anneal step of FIG. 4 creates small extensions 410 in source/drain regions 130. The n-type dopants diffuse from the layer 320 (preferably germanium dioxide in this example) into well 120 to create extensions 410. It should also be noted that deep source/drain regions 130, 160 will also be affected by this anneal and will diffuse in width and depth.

Figure 5:
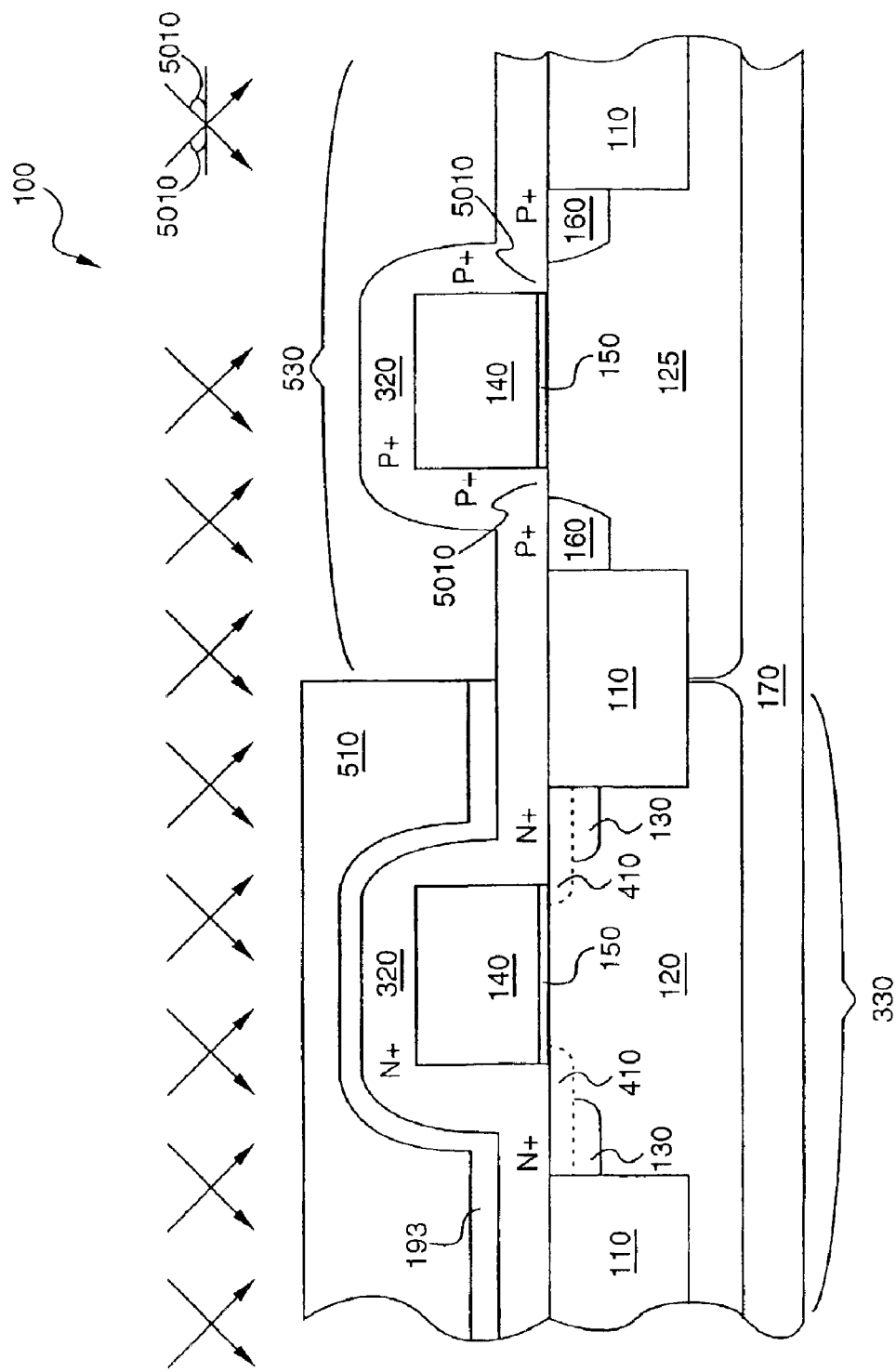

Referring now to FIG. 5, wafer 100 is shown after the preferable anneal step of FIG. 4. Furthermore, protective layer 193 has been added over the substrate, and photoresist film 510 has been added and patterned to reveal area 530 while covering area 330. Protective layer 193 is preferably removed over area 530 through dry etching. Alternatively, if a high temperature, inorganic material is used for protective layer 193, it may remain during implantation and anneal processing steps. Removable material 320 in location 530 is now implanted, preferably through a 45 to 60 degree angle (see angles 5010) implantation to implant areas 5020, with p-type dopants (such as boron). Again, the implantation energy, thickness of layer 520, dopants, and removable material 320 may be changed to ensure that the majority (>60%) of dopant is implanted into layer 320. For instance, for boron, implantation energies of 10 to 30 KeV, at 45 degree angled implantation should place the majority of the dopants into layer 320 of 100 nm thickness.

Figure 6:
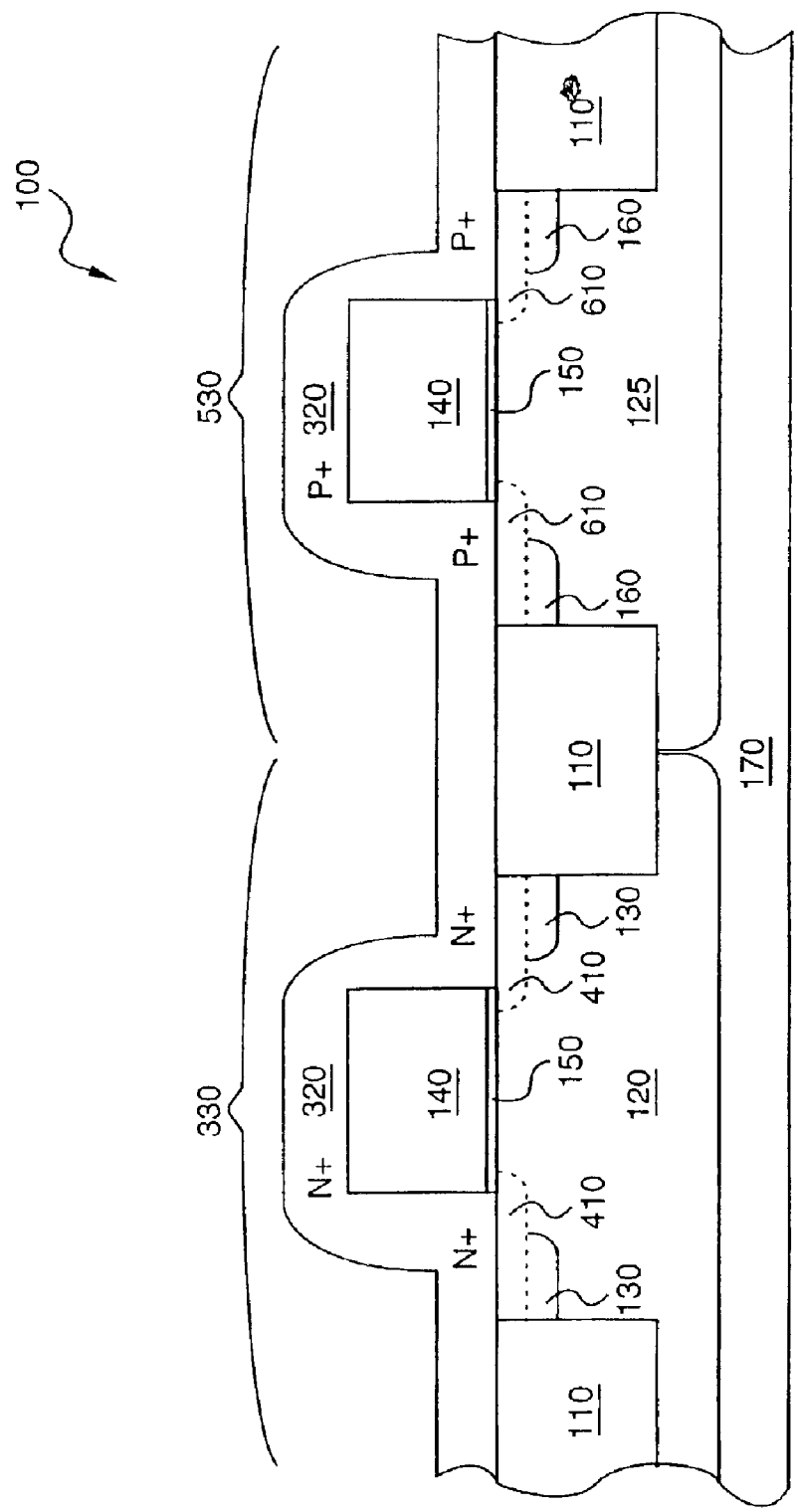

Turning now to FIG. 6, an anneal step is performed. As shown in FIG. 6, photoresist film 510 and protective coating 193 have been removed prior to the anneal. This anneal is preferably performed at a temperature of 900 to 1200° C. for a time of one second to 5 minutes. These anneal conditions should create extensions 410 and 610. It should be noted that times longer than the recited periods may cause too much overlapping between the extensions and the gate, resulting in lowered performance. In this anneal, both n-type and p-type dopants diffuse into wells 120, 125, respectively. It should also be noted that deep source/drain regions 130, 160 will also be affected by this anneal and will grow slightly in width and depth.

Figure 7:
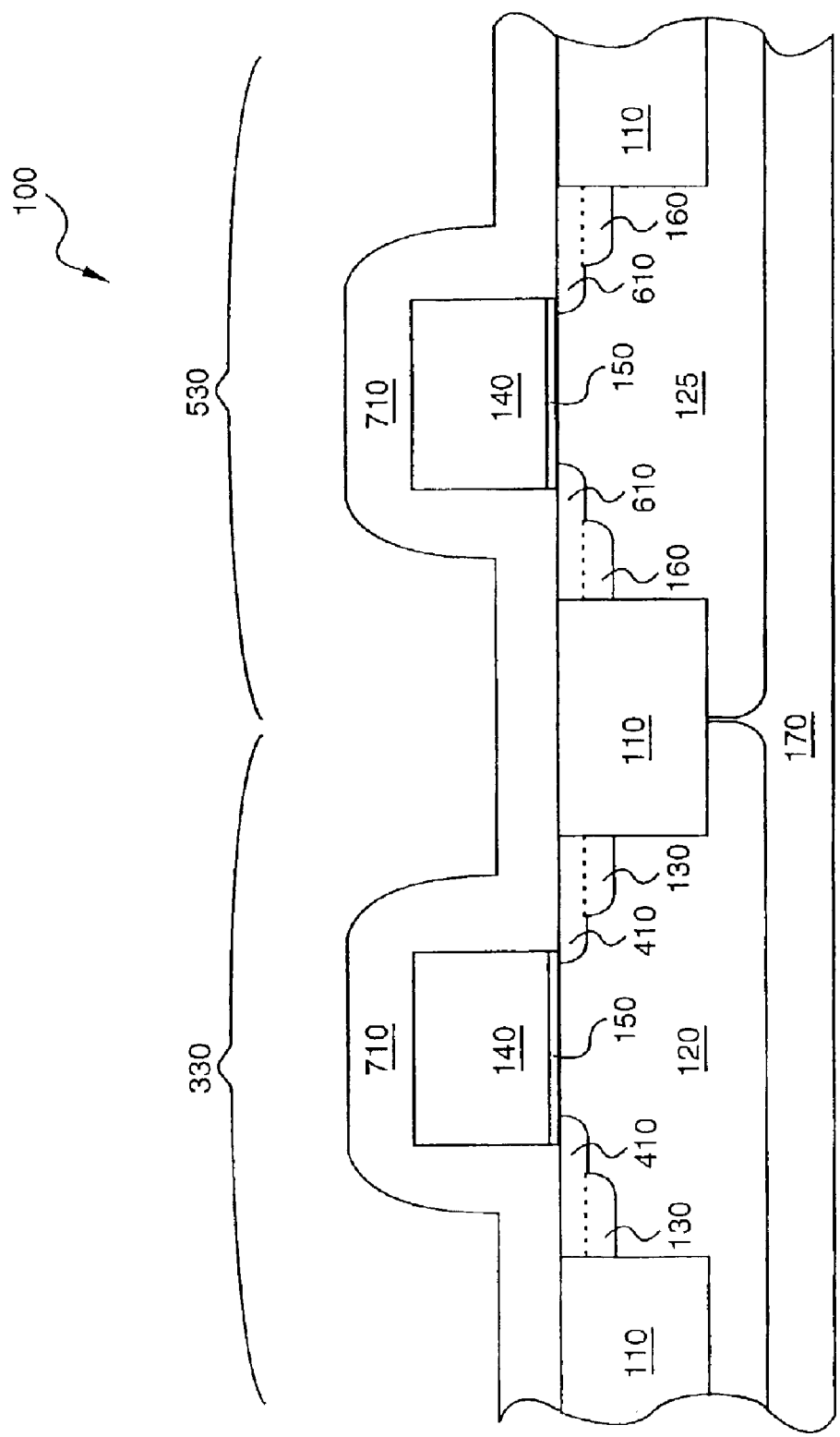
Figure 8:
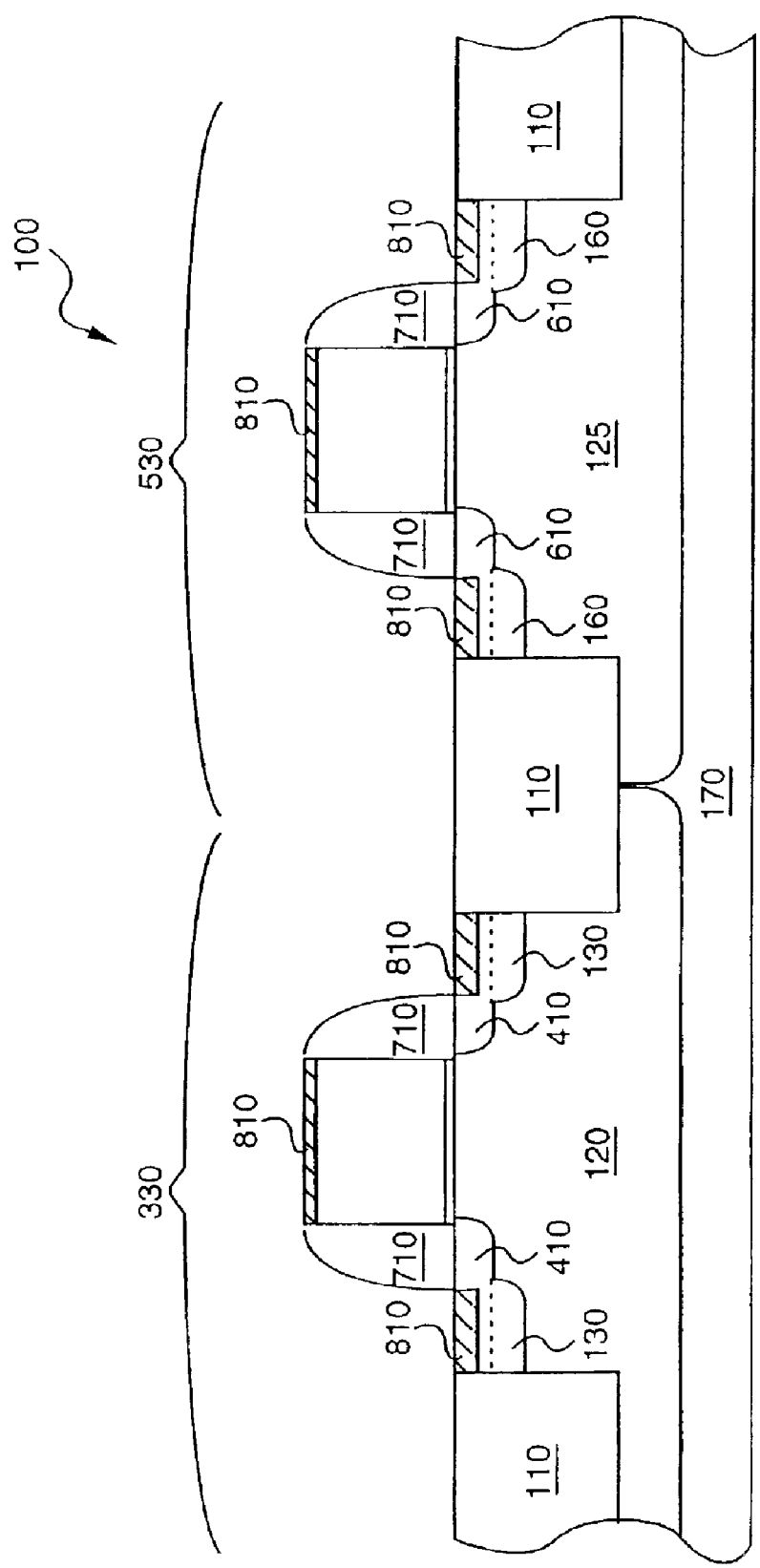

Referring now to FIG. 7, wafer portion 100 is shown after conformal layer 320 has been removed and another conformal layer 710 is deposited. Removed conformal layer 320 in this example was germanium dioxide, which was removed by immersion in water. Additionally, a conformal layer of material 710 has been deposited. In this example, material 710 is silicon dioxide or silicon nitride that will be used for sidewall spacers and that has been deposited through CVD. FIG. 8 shows wafer portion 100 after anisotropic etch (preferably RIE) has been performed to remove material 710 from horizontal surfaces yet leave material 710 on vertical surfaces. Additionally, silicide areas 810 (preferably cobalt silicide, although titanium silicide and other silicides may be used) have been added by any technique known to those skilled in the art. As is known in the art, the silicide over the diffusion areas reduces series resistance from the diffusion contact to the device channel. The silicide over the gate is to reduce wiring resistance of the poly-silicon gate.

Thus, the method of FIGS. 1–8 has created an NFET in location 330 and created a PFET in location 530, each of these having extensions with very shallow junctions and low resistivity.

Figure 9:
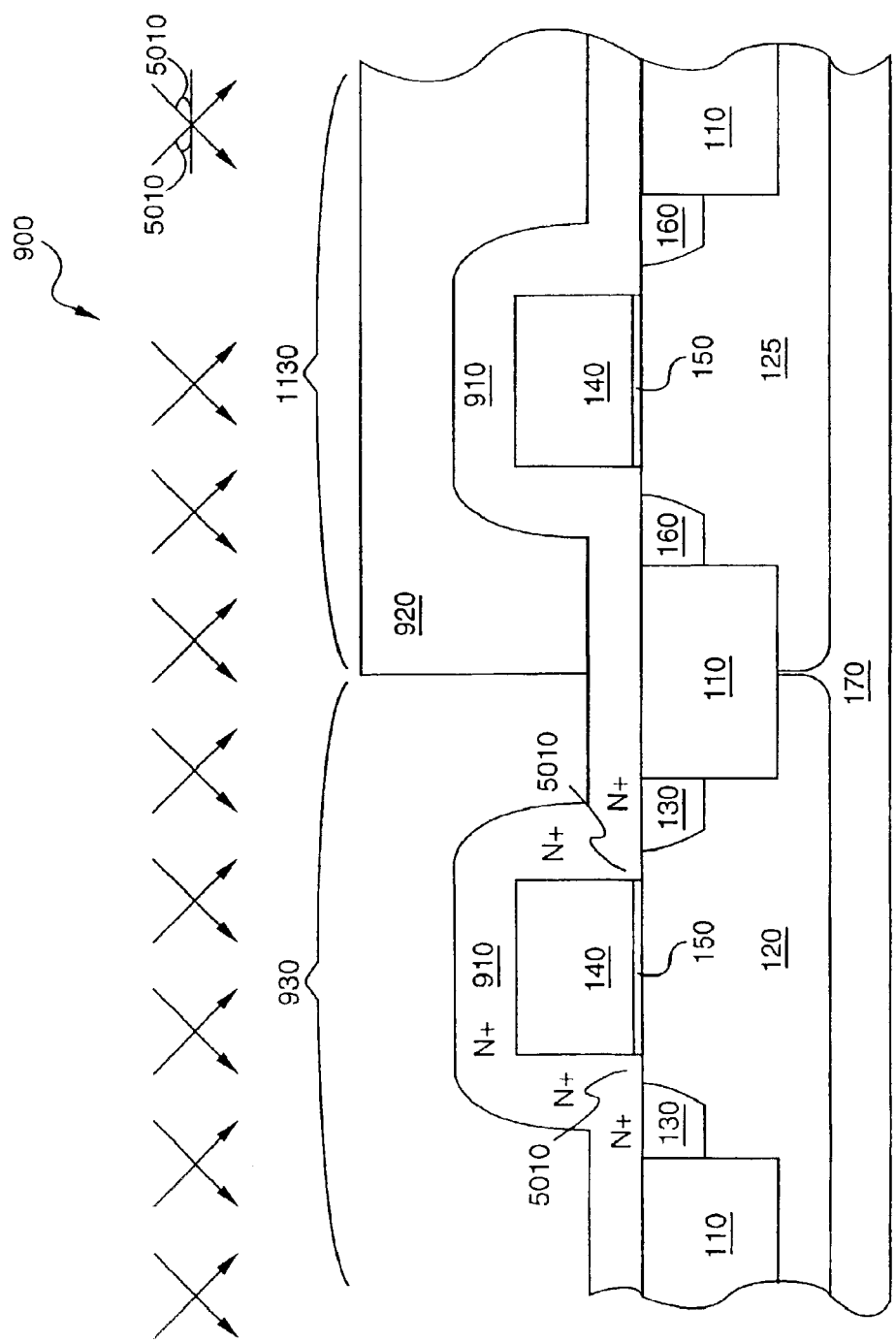
FIGS. 9–13 are cross-sectional views of successive processing steps for forming a CMOS device, having very shallow extensions, in accordance with a preferred embodiment of the present invention.

Turning now to FIG. 9, FIG. 9 illustrates a wafer portion 900 that is wafer portion 100 after FIGS. 1 and 2. In other words, ion implantation has already been performed to form deep source/drain regions 130 and 160. In FIG. 3, a removable material 320 was conformally deposited on wafer portion 100. Here, in contrast, a non-removable material 910 is deposited. Non-removable material 910 is, illustratively, silicon dioxide that is deposited through CVD. Photoresist film 920 has been deposited and patterned to expose area 930 while leaving area 1130 covered.

A relatively low energy, angled (preferably between 45 and 60 degrees, as shown by angles 5010) implantation of n-type (As or P) dopants is performed. This implantation dopes film 910 in area 930, and the implantation is preferably angled to dope areas 5020. It is preferred that the thickness of film 910 be about 50 to 200 nm, and that the energy of implantation be adjusted so that the majority of the dose is implanted in the film (higher energy for thicker film and lower energy for thinner film). Preferably, the implantation energy, dopant type, non-removable material 910, and thickness of non-removable material 910 are chosen such that the majority (>60%) of dopants implant into film 910.

Figure 10:
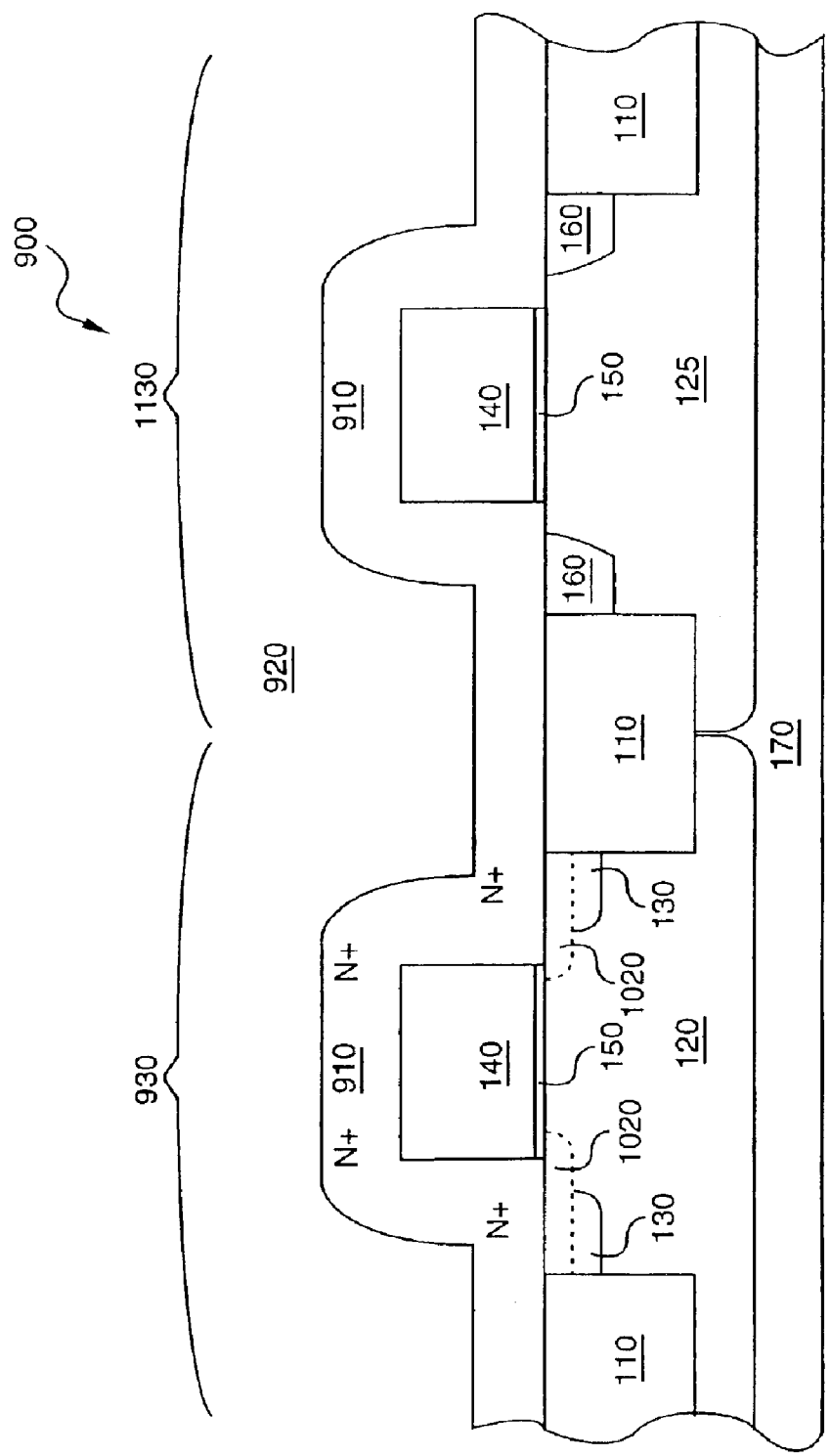

Referring now to FIG. 10, an optional but preferred anneal in the case of As dopants is performed. FIG. 10 is shown after photoresist film 920 has been stripped. The anneal allows the As to diffuse into well 120 to create extensions 1020. As previously explained, As diffuses more slowly than B.

Figure 12:
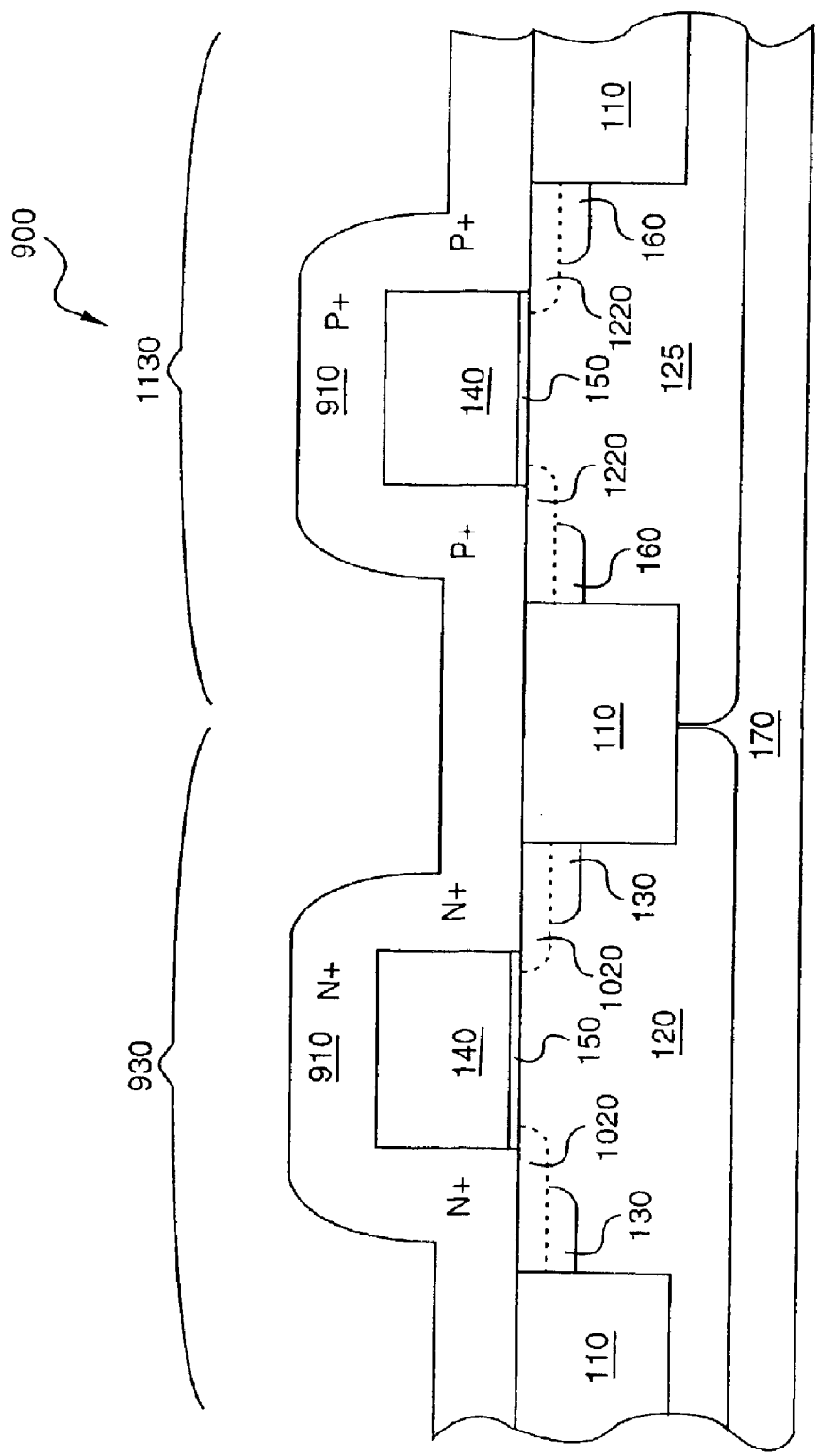

Turning now to FIG. 1, wafer portion 900 is shown after the n+ extension has been partially formed and after photoresist film 1120 has been applied and patterned to expose area 1130 while covering area 930. A relatively low energy implantation of p-type dopants is performed. This implantation preferably dopes film 910 (preferably silicon dioxide in this example) with p-type dopants, such as boron. In FIG. 12, an anneal is performed to drive dopants from film 910 into the underlying substrate. In this case, the n-type dopants diffuse further into well 120 to deepen and widen extensions 1020, and p-type dopants diffuse into well 125 to create extensions 1220. It is preferred that extensions 1020 and 1220 be approximately the same width and length.

Figure 13:
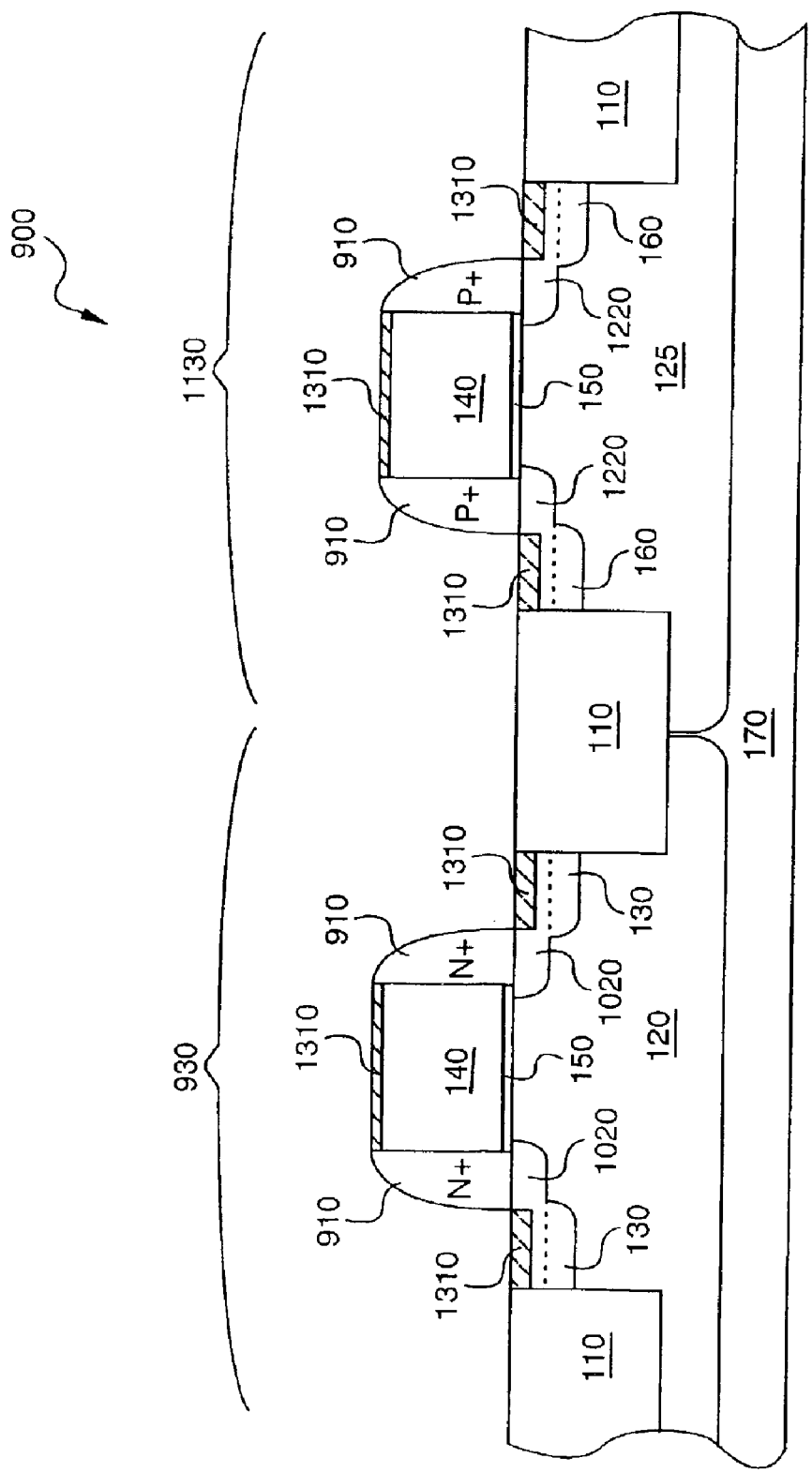

FIG. 13 illustrates wafer portion 900 after photoresist film 1120 is stripped, and an anisotropic etch is performed to remove layer 910 from the horizontal surfaces while keeping the layer on the vertical surfaces. This etch is preferably an RIE that creates sidewall spacers 910. Sidewall spacers 910 are doped (as indicated in FIG. 13) from the previous implantation steps. Silicide areas (composed preferably of cobalt silicide, although titanium silicide or other silicides may be used) 1310 have been added. The silicide over the diffusion areas reduces series resistance from the diffusion contact to the device channel. The silicide over the gate is to reduce wiring resistance of the polysilicon gate.

Thus, the method of FIGS. 1–2 and 9–13 has created an NFET in location 930 and created a PFET in location 1130, each of these having extensions with very shallow junctions and low resistivity.

Figure 14:
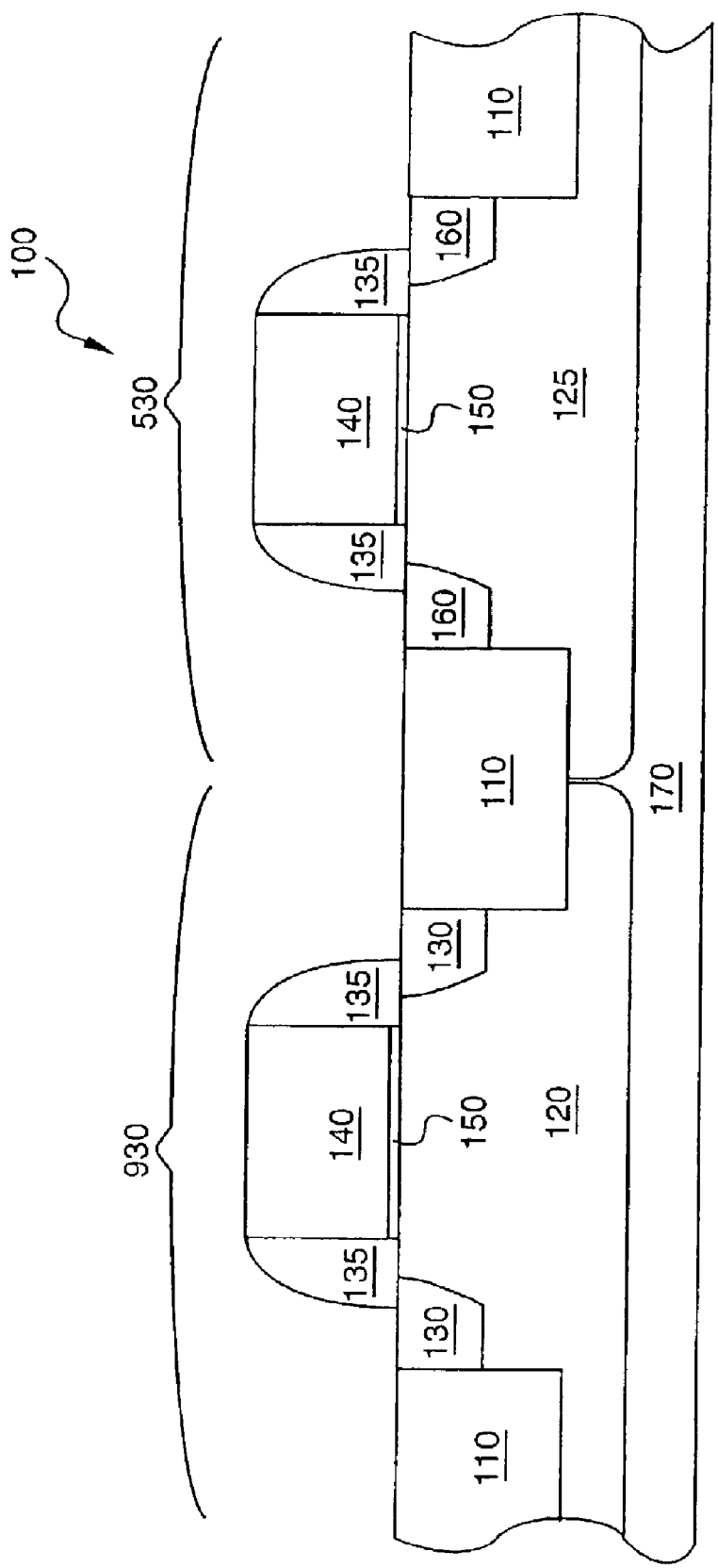
FIG. 14 is a cross-sectional view of a processing step for removing sidewall spacers in accordance with a preferred embodiment of the present invention.

Another alternate method is illustrated by FIG. 14. FIG. 14 shows wafer portion 100 after FIGS. 1 and 2 have been performed. In the previous discussion of FIGS. 1 and 2, material 135 was preferably germanium dioxide that had been conformally deposited and isotropically etched to create sidewall spacers. In the current embodiment, material 135 is poly-germanium, amorphous germanium, or germanium-rich silicon-germanium ($Si_xGe_{(1-x)}$, with x less than or equal to 0.3) that has been conformally deposited, preferably through CVD, and isotropically etched, preferably by RIE. This creates sidewall spacers 135. The photoresist patterning, photoresist stripping, deep implantation, and anneal steps have been performed to create and activate deep source/drain regions 130 and 160.

To remove the poly-germanium, amorphous germanium, or germanium-rich silicon-germanium spacers 135, the semiconductor wafer is placed in an oxygen-containing atmosphere at an elevated temperature or in a plasma-oxygen atmosphere (which allows lower temperatures to be used). Preferably the temperature range is 500–700° C., which should not drive much diffusion. Most importantly, this temperature range should cause minimal oxidation of polysilicon 140 and the silicon substrate. Most preferably, the poly-germanium, amorphous germanium or germanium-rich silicon-germanium is oxidized at the low end of 500–600° C. in a plasma-oxygen atmosphere. The plasma-oxygen atmosphere is used to lower the temperatures to the most preferable, recited temperature range. This process should allow all poly-germanium or amorphous germanium to be converted to germanium dioxide, or allow all germanium-rich silicon-germanium to be converted to germanium-rich silicon-germanium dioxide. The dioxide can then be removed by placing the semiconductor wafer in pure water. The process of oxidation and dissolution of $GeO_2$ may be repeated if necessary to remove all the Ge film.

Additional processing to create extensions may be performed by depositing a conformal layer of removable or non-removable material used for doping the extensions by thermal anneal. Such methods have been previously shown. Alternatively, a less preferred method is to use normal ion implantation to create the extensions. As previously discussed, the method causes a deeper junction due to enhanced dopant diffusion by the effects caused by ion implantation.

Figure 15:
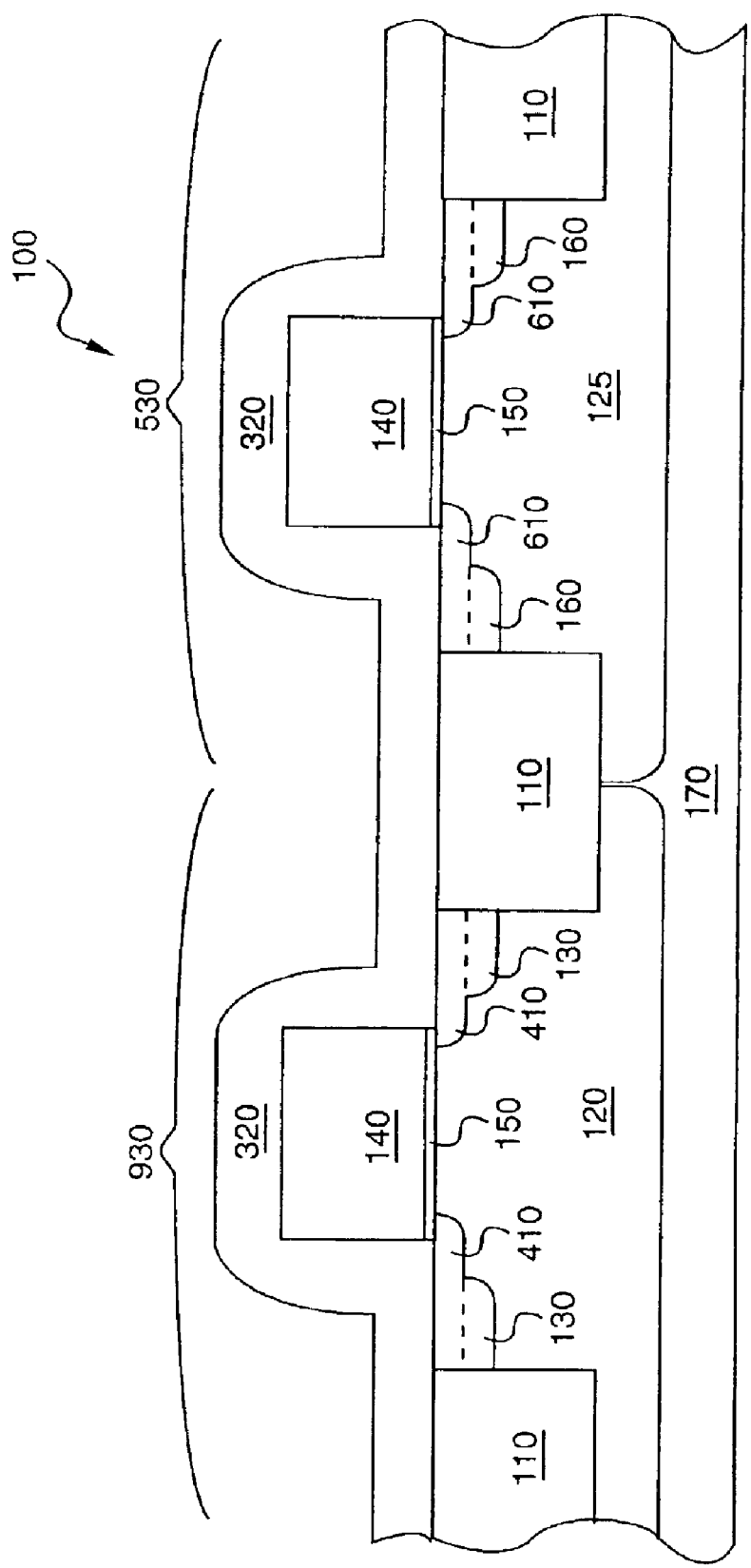
FIG. 15 is a cross-sectional view of a processing step for removing a conformally deposited film in accordance with a preferred embodiment of the present invention.

Turning now to FIG. 15, this figure illustrates another preferred embodiment having removable film 320. FIG. 15 shows wafer portion 100 after extensions 610 and 410 have been created through doping film 320 and through thermal anneal to create diffusion from film 320 into the underlying layers. In terms of the method of FIGS. 1–8, FIG. 15 shows wafer portion 100 after FIG. 6 and after photoresist layer 510 has been removed. In the method of FIGS. 1–8, removable material 320 was preferably germanium dioxide. In this embodiment, layer 320 is a poly-germanium, amorphous germanium, or germanium-rich silicon-germanium ($Si_xGe_{(1-x)}$, with x less than or equal to 0.3) layer deposited preferably through CVD. To create a removable substance, wafer portion 100 is placed in an oxygen-containing atmosphere at an elevated temperature. Preferably the temperature range is 500–700° C., which should not drive much diffusion. Most importantly, this temperature ranges should cause only minimal silicon oxidation. Most preferably, the poly-germanium, amorphous germanium, or germanium-rich silicon-germanium is oxidized at the low end of 500–600° C. in a plasma-oxygen atmosphere to keep the temperature range low yet provide a relatively high oxidation rate for the germanium. The plasma-oxygen atmosphere is used to lower the temperatures to the most preferable, recited temperature range. This process should allow all poly-germanium or amorphous germanium to be converted to germanium dioxide, or allow all germanium-rich silicon-germanium to be converted to germanium-rich silicon-germanium dioxide. The dioxide can then be removed by placing the semiconductor wafer in pure water.

Additional processing steps may be performed, as described above, to create NFET and PFET devices. Moreover, the preferred embodiments were described with a bulk silicon substrate, but the similar process can be applied to silicon-on-insulator or silicon-germanium substrate for the same benefits.

While the invention has been particularly shown and described with reference to preferred embodiments thereof, it will be understood by those skilled in the art that various changes in form and details may be made therein without departing from the spirit and scope of the invention. Accordingly, unless otherwise specified, any dimensions of the apparatus indicated in the drawings or herein are given as an example of possible dimensions and not as a limitation. Similarly, unless otherwise specified, any sequence of steps of the method indicated in the drawings or herein are given as an example of a possible sequence and not as a limitation.

What is claimed is:

1. A method comprising the steps of:
    a) forming a gate oxide over a substrate of a semiconductor wafer;
    b) depositing and patterning at least one gate layer to create a gate, the patterning creating two exposed substrate regions of the semiconductor wafer on opposing sides of the gate; and
    c) forming and patterning a first conforming layer comprising germanium to form sidewall spacers on sidewalls of the gate, wherein the germanium in the sidewall spacers consists of poly-germanium or amorphous germanium;
    d) implanting the exposed substrate regions of the semiconductor wafer with the dopant of a first type to implant source/drain regions in the substrate;
    e) heating the substrate sufficiently to anneal and activate the dopant of the first type to further form the source/drain regions in the substrate;
    f) heating the substrate in a plasma comprising oxygen at a temperature in a range of 500 to 600 degrees centigrade, wherein essentially all of the germanium in the sidewall spacers is converted into water-soluble germanium dioxide;
    g) removing essentially the entire sidewall spacers by placing the semiconductor wafer in water such that essentially all of the water-soluble germanium dioxide is dissolved in the water;
    h) forming a second conforming layer over the gate and source/drain regions; and
    i) doping the second conforming layer with the dopant of the first type to form extensions in the source/drain regions.

2. The method of claim 1, wherein germanium substance in the layer consists of amorphous germanium.

3. The method of claim 1, wherein the germanium substance in the layer consists of poly-germanium.

4. The method of claim 1, wherein the substrate includes a p-well and an n-well.

5. The method of claim 1, wherein the substrate includes polysilicon.

6. The method of claim 1, wherein the step of forming and patterning the first conforming layer comprising germanium comprises the step of depositing the germanium through chemical vapor deposition.

7. A method, comprising the steps of:
    a) forming a gate oxide over a substrate of a semiconductor wafer;
    b) depositing and patterning at least one gate layer to create a gate, the patterning creating two exposed substrate regions of the semiconductor wafer on opposing sides of the gate; and c) forming and patterning a first conforming layer comprising germanium to form sidewall spacers on sidewalls of the gate, wherein the germanium in the sidewall spacers consists of germanium-rich silicon-germanium ($Si_xGe_{(1-x)}$);

d) implanting the exposed substrate regions of the semiconductor wafer with a dopant of a first type to implant source/drain regions in the substrate;

e) heating the substrate sufficiently to anneal and activate the dopant of the first type to further form the source/drain regions in the substrate;

f) heating the substrate in a plasma comprising oxygen at a temperature in a range of 500 to 600 degrees centigrade, wherein essentially all of the germanium-rich silicon-germanium in the sidewall spacers is converted into water-soluble germanium-rich silicon-germanium dioxide;

g) removing essentially the entire sidewall spacers by placing the semiconductor wafer in water such that essentially all of the water-soluble germanium-rich silicon-germanium dioxide is dissolved in the water;

h) forming a second conforming layer over the gate and source/drain regions; and i) doping the second conforming layer with the dopant of the first type to form extensions in the source/drain regions.

8. The method of claim 7, wherein the step of forming and patterning the first conforming layer comprising germanium comprises the step of depositing the $Si_xGe_{(1-x)}$ through chemical vapor deposition.

9. The method of claim 8, wherein x is less than or equal to 0.3.

10. The method of claim 7, wherein the substrate includes an a p-well and an n-well.

11. The method of claim 7, wherein the substrate includes polysilicon.

* * * * *

UNITED STATES PATENT AND TRADEMARK OFFICE
CERTIFICATE OF CORRECTION

PATENT NO.   : 6,924,200 B2                                                             Page 1 of 1
DATED        : August 2, 2005
INVENTOR(S)  : Furukawa et al.

Figure 11:
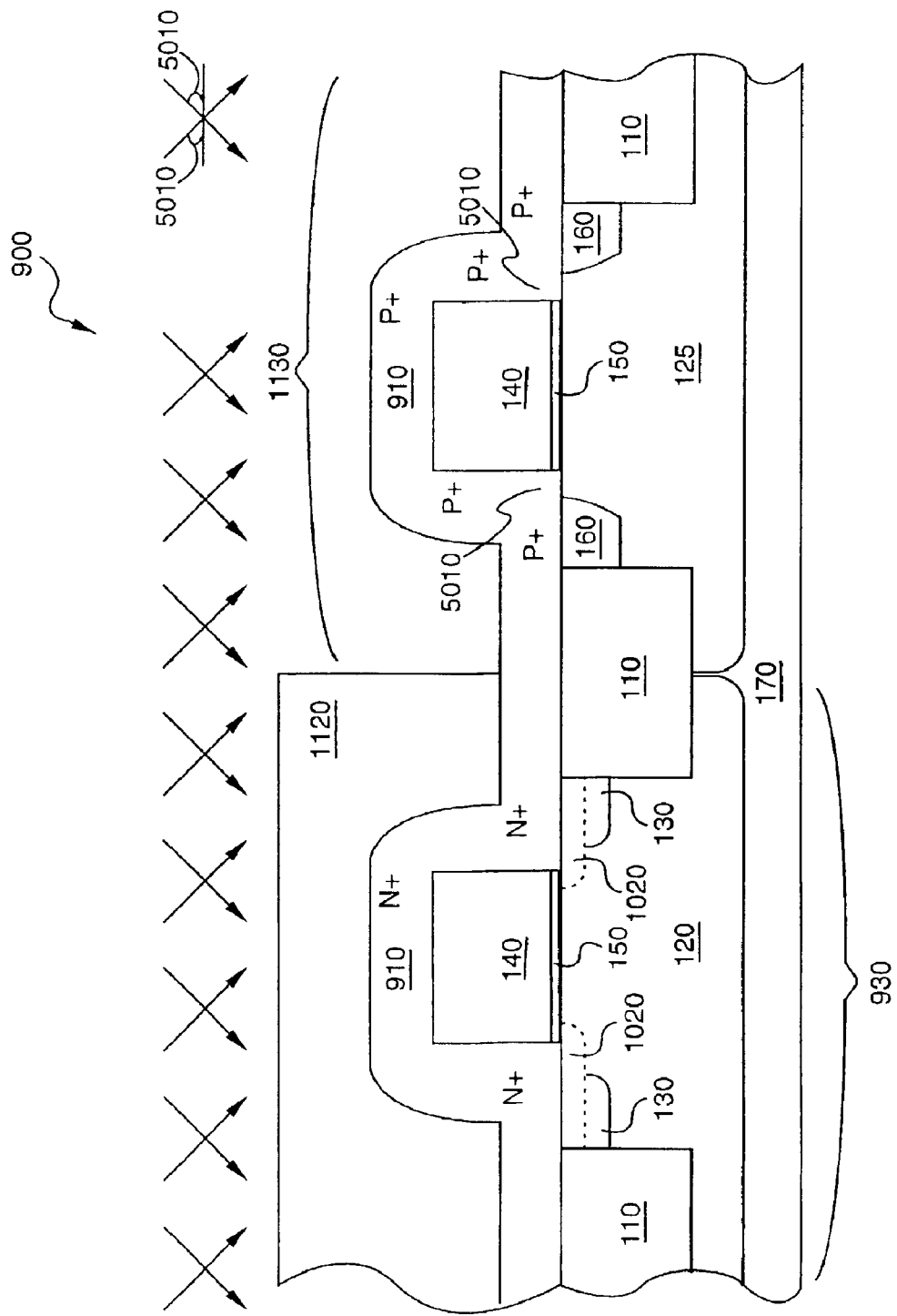

It is certified that error appears in the above-identified patent and that said Letters Patent is hereby corrected as shown below:

Column 8,
Line 29, delete "FIG. 1" and insert -- FIG. 11 --.

Signed and Sealed this

First Day of November, 2005

JON W. DUDAS
*Director of the United States Patent and Trademark Office*